(12) United States Patent
Hwu et al.

(10) Patent No.: US 8,496,771 B2
(45) Date of Patent: Jul. 30, 2013

(54) METHOD OF FILLING AND SEALING A FLUORESCENT LAYER IN A SLOT SPACE DEFINED BY TWO OPTICAL LENSES AND A PARTITION RING

(75) Inventors: Jon-Fwu Hwu, Hsinchu (TW); Yung-Fu Wu, Hsinchu (TW); Kui-Chiang Liu, Hsinchu (TW)

(73) Assignee: Gem Weltronics TWN Corporation, Hsinchu County (TW)

( * ) Notice: Subject to any disclaimer, the term of this patent is extended or adjusted under 35 U.S.C. 154(b) by 352 days.

(21) Appl. No.: 13/014,708

(22) Filed: Jan. 26, 2011

(65) Prior Publication Data

US 2012/0186726 A1     Jul. 26, 2012

(51) Int. Cl.
*B32B 17/00*     (2006.01)
(52) U.S. Cl.
USPC ............ 156/99; 156/104; 156/285; 156/286; 264/261; 264/262

(58) Field of Classification Search
USPC .... 156/99, 104, 285, 286, 381, 382; 264/261, 264/262
See application file for complete search history.

(56) References Cited

U.S. PATENT DOCUMENTS

| | | | | |
|---|---|---|---|---|
| 3,933,552 | A * | 1/1976 | Shumaker | 156/104 |
| 4,588,921 | A * | 5/1986 | Tischer | 313/496 |
| 4,951,927 | A * | 8/1990 | Johnston et al. | 264/129 |
| 5,106,441 | A * | 4/1992 | Brosig et al. | 156/104 |
| 2002/0069961 | A1* | 6/2002 | Kobayashi et al. | 156/285 |
| 2006/0243947 | A1* | 11/2006 | Tsumura et al. | 252/299.01 |
| 2007/0158021 | A1* | 7/2007 | Sawai et al. | 156/285 |
| 2007/0261795 | A1* | 11/2007 | Rosskamp et al. | 156/556 |

\* cited by examiner

*Primary Examiner* — Christopher Schatz

(57) ABSTRACT

A method of filling and sealing a fluorescent layer in a slot space defined by two optical lenses and a partition ring is disclosed, in which a slot space is defined by two optical glasses and a partition frame having a partition ring on the inner wall surface. The partition frame is installed with two slots diametrically opposite to each other, and the slot space is evacuated to allow filling of a fluorescent material, and then the two slots are sealed so that the moisture is prevented from permeating into the fluorescent layer, and thus the optical performance can be maintained over a long period.

17 Claims, 12 Drawing Sheets

METHOD OF FILLING AND SEALING A FLUORESCENT LAYER IN A SLOT SPACE DEFINED BY TWO OPTICAL LENSES AND A PARTITION RING

BACKGROUND OF THE INVENTION

1. Field of the Invention

The present invention relates a method of filling and sealing a fluorescent layer in a slot space defined by two optical lenses and a partition ring, and especially to a method of completely sealing a fluorescent layer in a slot space defined by two optical glasses and a fastening frame, so that the moisture is prevented from permeating into the fluorescent layer, and thus the optical performance can be maintained over a long period, and the method of the present invention can be applied to a light emitting diode (LED) array package.

2. The Prior Arts

An LED is a solid-state semiconductor device, which operates based on the recombination of carriers (electrons and holes) in a semiconductor. When an electron in the conduction band combines with a hole in the valence band, it loses energy equal to the bandgap of the semiconductor in the form of an emitted photon, i.e., light. The LED has advantages of compact volume, fast start-up time and high efficiency so that it has been applied to various fields.

Referring to FIG. 1, which is a cross sectional view showing a conventional array-type LED package structure, which includes a substrate 10a, a package module 12a, a lead frame 14a, and a packaging cover 16a. The substrate 10a is installed at the bottom of the package structure. The package module 12a is served to integrate the substrate 10a and the lead frame 14a. The LED dices 18a are arranged on the substrate 10a in an array form, and the substrate 10a is made of a metal material. The LED dices 18a are electrically connected to the lead frame 14a. The packaging cover 16a is closely engaged with the package module 12a. An insulating protective layer 20a is formed on the LED dices 18a for covering the LED dices 18a. Then, a fluorescent layer 22a is formed on the insulating protective layer 20a.

However, one disadvantage of the prior art is that the fluorescent layer of the LED dice is directly in contact with moisture in the air. It is known that a fluorescent material can absorb moisture and would result in the deterioration of light property, and an initially white light would gradually decays while changing its hue. Moreover, the fluorescent layer can directly absorb heat generated by light irradiation. In general, the heat resistant temperature and thermal stability of a fluorescent layer are relatively low, and thereby once heat generated by light irradiation is conducted to the fluorescent layer, the fluorescent material would deteriorate and the illumination efficiency is affected and the chromaticity is altered.

Moreover, if a fluorescent material is formed on an LED chip by filling or coating, an extra amount of the fluorescent material has to be provided for ensuring that the fluorescent material will form substantially uniformly on a LED chip, which will increase the manufacturing cost. Moreover, if the fluorescent layer has flaws, the LED chip can not be recycled and reused. In a conventional method, various optical tests can only be carried out after the formation of the fluorescent layer. Therefore, there is a need to provide an LED package structure which can be optically tested in advance, has relatively low manufacturing cost, and has excellent heat dissipation.

SUMMARY OF THE INVENTION

The objective of the present invention is to provide a method of filling and sealing a fluorescent layer in a slot space defined by two optical lenses and a partition ring. A partition frame is firstly provided. An inwardly protruding partition ring is arranged on the inner wall surface of the partition frame. An L-shaped structure is defined by a top surface of the partition ring and the inner wall surface of the partition frame, and a reverse L-shaped structure is defined by a bottom surface of the partition ring and the inner wall surface of the partition frame, wherein the partition ring of the partition frame is installed with at least two slots. A top optical glass and a bottom optical glass are respectively installed on the top surface and on the bottom surface of the partition ring. The top optical glass and the surface of the L-shaped structure, and the bottom optical glass and the surface of the reverse L-shaped structure are all integrally adhered and sealed together, so that a slot space is defined by the top optical glass, the bottom optical glass, and the partition ring of the partition frame. The top optical glass, the bottom optical glass, and the partition frame adhered and sealed together are put in a vacuum chamber. The slot space is evacuated through the at least two slots, and then a fluorescent material is filled in the slot space so as to form a fluorescent layer. An adhesive is used to seal the at least two slots, or a nail member coated with an adhesive is used to seal the two slots.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
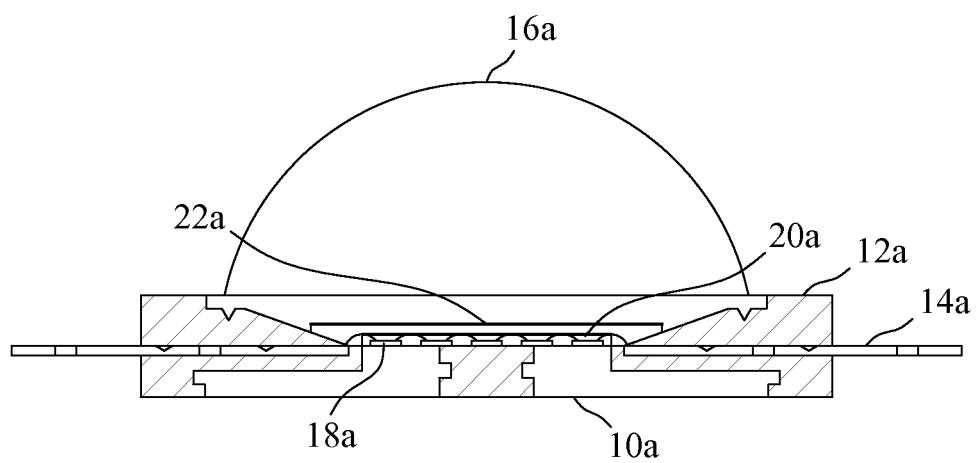
FIG. 1 is a cross sectional view showing a conventional LED package structure.
Figure 2:
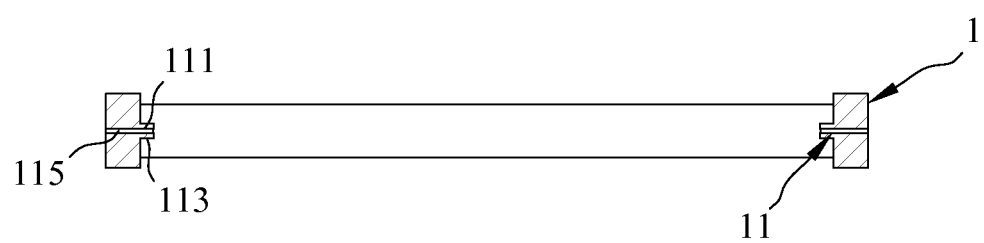
FIG. 2 is a schematic view showing the method of filling and sealing a fluorescent layer in a slot space defined by two optical lenses and a partition ring according to the present invention.

Referring to FIGS. 2-6, which are schematic views showing the method of filling and sealing a fluorescent layer in a slot space defined by two optical lenses and a partition ring according to the present invention. As shown in FIG. 2, a partition frame 1 is provided, and an inwardly protruding partition ring 11 is arranged on the inner wall surface of the partition frame 1. The inwardly protruding partition ring 11 has a top surface 111 and a bottom surface 113. An L-shaped structure is defined by the top surface 111 of the partition ring 11 and the inner wall surface of the partition frame 1. A reverse L-shaped structure is defined by the bottom surface 113 of the partition ring 11 and the inner wall surface of the partition frame 1. At least two slots 115 are located in the partition ring 11 diametrically opposite to each other.

Figure 7:
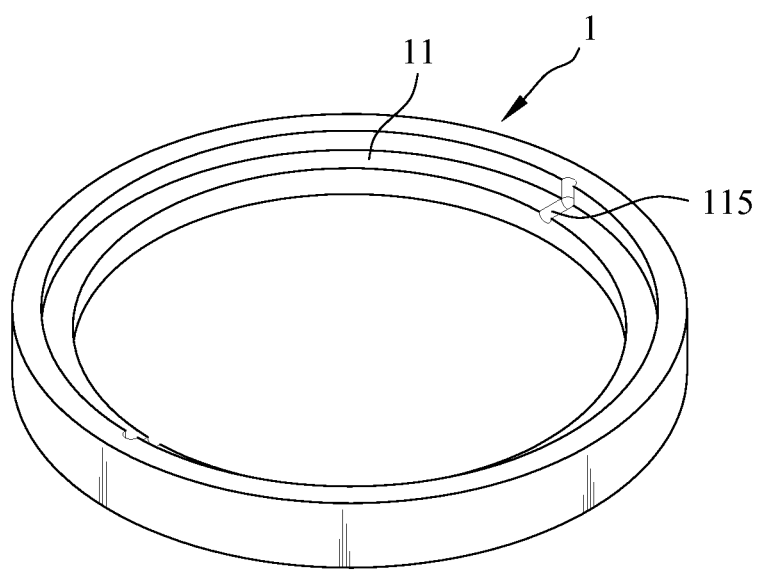
FIG. 7 is a schematic view showing the partition frame according to the first embodiment of the present invention.

The two slots 115 diametrically opposite to each other can be the through-holes installed in the partition ring 11, or the two slots 115 can be formed on the surfaces of the L-shaped structures. Referring to FIG. 7, one opening end of each of the two slots 115 is arranged on the inner surface of the partition ring 1, and the other opening end of each of the two slots 115 is arranged on the top surface of the partition frame 1. The two slots 115 can also be the through-holes installed in the partition frame 1. However, the arrangement and the quantities of the slots 115 depend on the actual needs. The two slots disclosed in this embodiment are served for illustration and shall not be a limitation to the scope of the present invention, and any slot arrangement which can communicate the interior and exterior of the partition frame 1 is within the scope of the present invention.

The material of the partition frame 1 includes at least one of glass, aluminum, bronze, ceramic and an alloy composed of at least one of aluminum and bronze, or includes at least one of liquid crystal polymer (LCP), polyphthalamide (PPA), and all high temperature resistant materials. The shape of the partition frame 1 includes round, oval, rectangular and polygonal shapes.

Figure 3:
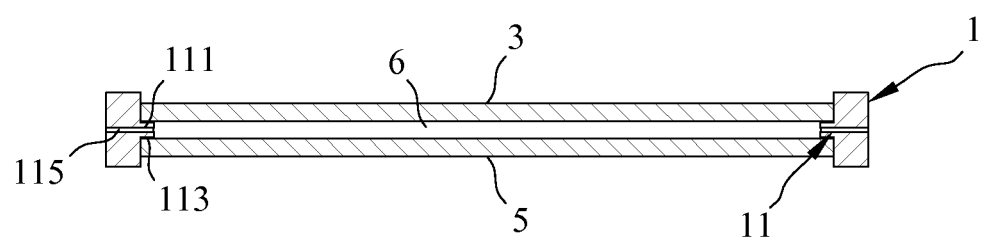
FIG. 3 is a schematic view showing the method of filling and sealing a fluorescent layer in a slot space defined by two optical lenses and a partition ring according to the present invention.

A top optical glass 3 and a bottom optical glass 5 are respectively installed on the top surface 111 and the bottom surface 113 of the partition ring 11. The top optical glass 3 and the surface of the L-shaped structure and the bottom optical glass 5 and the surface of the reverse L-shaped structure are integrally adhered and sealed, such that a slot space 6 is defined by the top optical glass 3, the bottom optical glass 5 and the partition ring 11 of the partition frame 1, as shown in FIG. 3.

Figure 4:
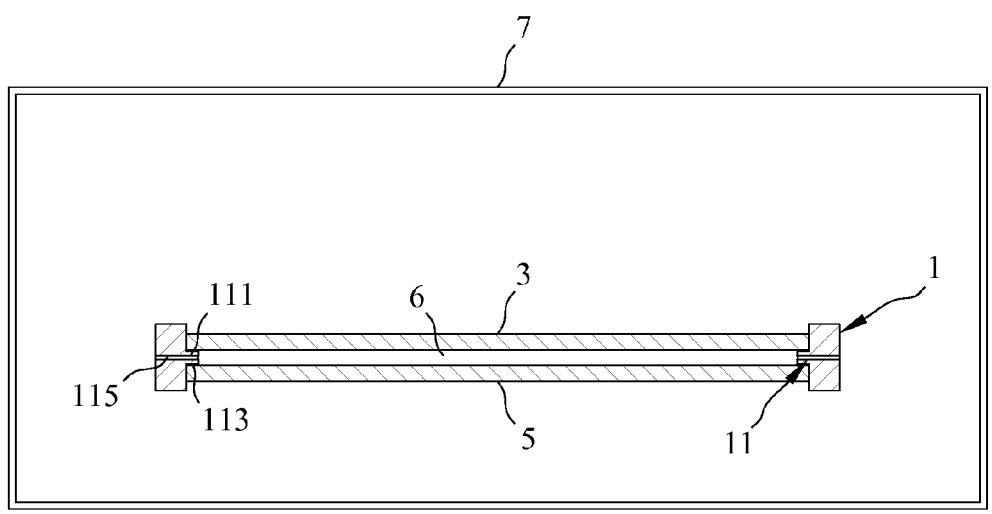
FIG. 4 is a schematic view showing the method of filling and sealing a fluorescent layer in a slot space defined by two optical lenses and a partition ring according to the present invention.
Figure 5:
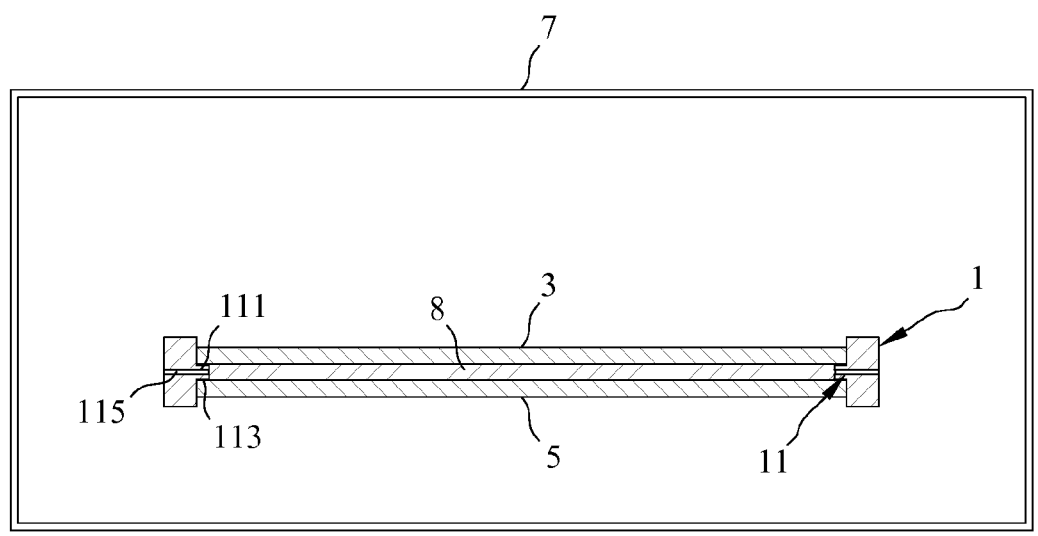
FIG. 5 is a schematic view showing the method of filling and sealing a fluorescent layer in a slot space defined by two optical lenses and a partition ring according to the present invention.

After being assembled, the top optical glass 3, the bottom optical glass 5 and the partition frame 1 are together disposed in a vacuum chamber 7, as shown in FIG. 4. The slot space 6 is evacuated with a vacuum pump through the at least two slots 115, meanwhile the slot space 6 is filled with a fluorescent material, so as to form a fluorescent layer 8 in the slot space 6, as shown in FIG. 5.

Figure 6:
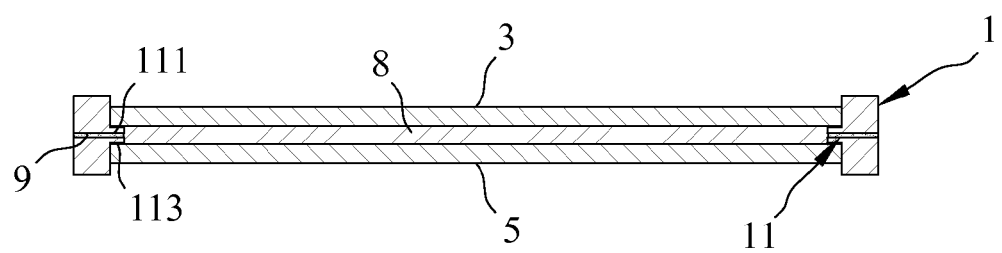
FIG. 6 is a schematic view showing the method of filling and sealing a fluorescent layer in a slot space defined by two optical lenses and a partition ring according to the present invention.

As shown in FIG. 6, the adhesive 9 is used to seal the at least two slots 115, then the adhesive 9 is filled into the slot space, so that the fluorescent layer 8 is prevented from leaking while being in a liquid state, or a nail member (not shown) coated with the adhesive 9 can be used to seal the at least two slots 115. The adhesive 9 includes at least one of ultraviolet curing adhesive, silicon, epoxy resin and polyimide, and the material of the nail member includes at least one of plastic and metal.

Figure 8:
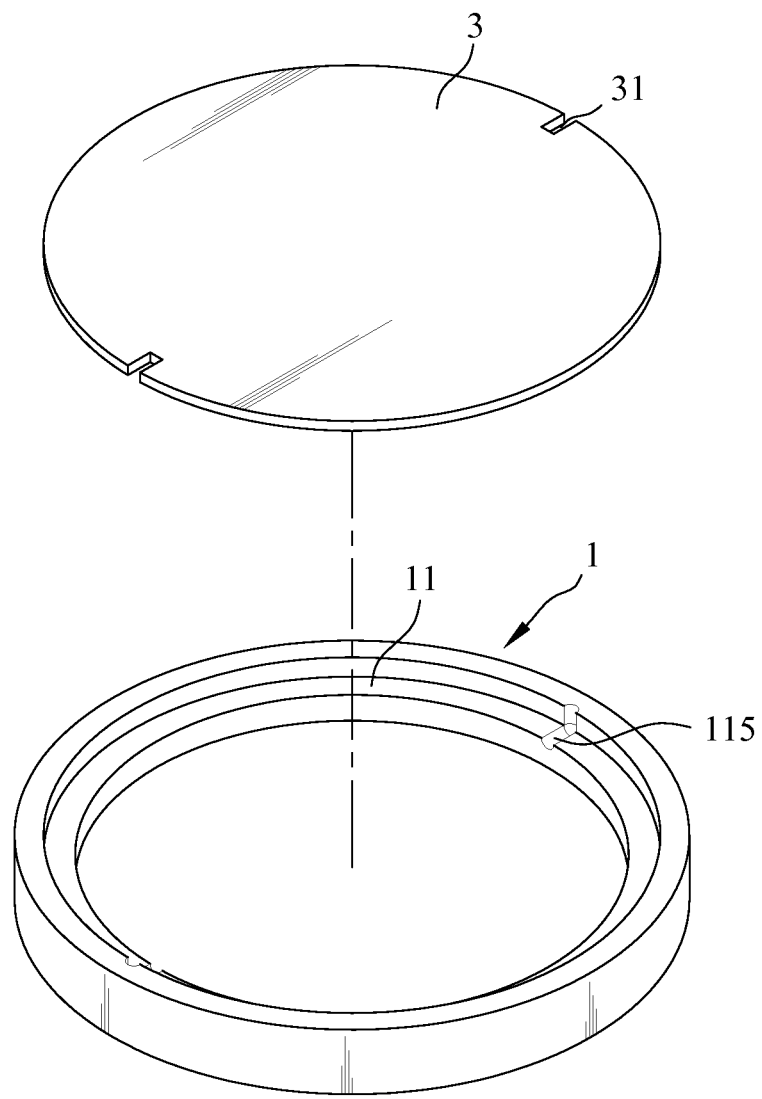
FIG. 8 is a schematic view showing the partition frame according to the second embodiment of the present invention.

Referring to FIG. 8, which is a schematic view showing the partition frame according to the second embodiment of the present invention. The two slots 115 are respectively installed on the surface of the partition ring 11 diametrically opposite to each other. The top optical glass 3 is formed with two grooves 31 diametrically opposite to each other, and the two grooves 31 can communicate with the two slots 115, so that the adhesive 9 can be filled in the two slots and the two grooves.

Figure 9:
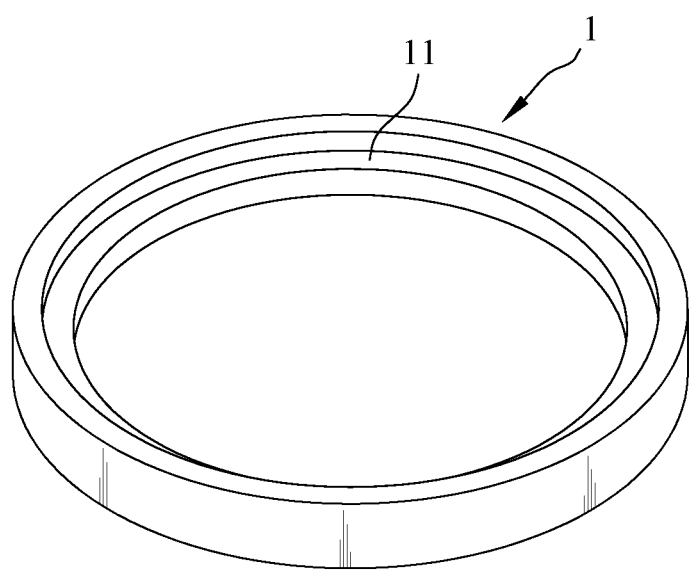
FIG. 9 is a schematic view showing the partition frame according to the third embodiment of the present invention.

Referring to FIG. 9, which is a schematic view showing the partition frame according to the third embodiment of the present invention. The partition ring 11 of the partition frame 1 is made of ultraviolet curing adhesive, silicon, epoxy resin, or polyimide.

Figure 10:
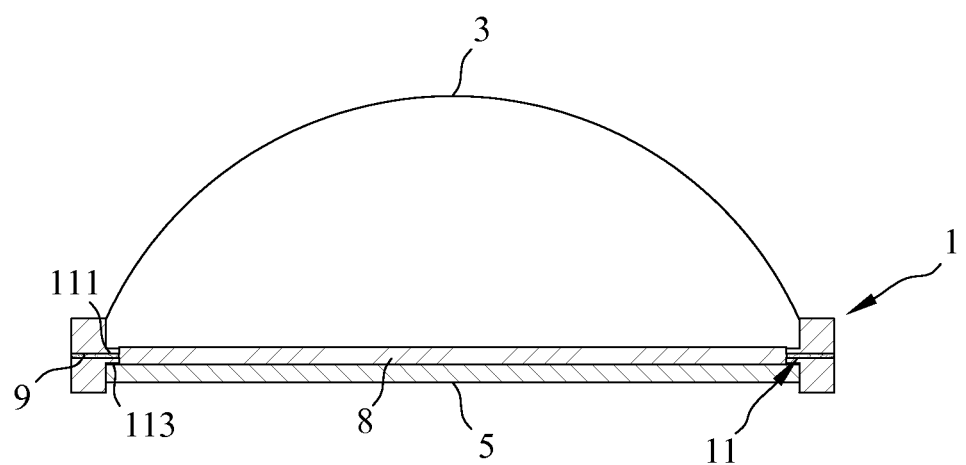
FIG. 10 is a schematic view showing the top optical glass according to one embodiment of the present invention.

Referring to FIG. 10, which is a schematic view showing the top optical glass according to one embodiment of the present invention. In FIG. 3 to FIG. 6, the top optical glass 3 or the bottom optical glass 5 can be a flat lens, and the top optical glass 3 can also be a convex lens of which the top surface is convex for obtaining different optical guiding effects.

Figure 11:
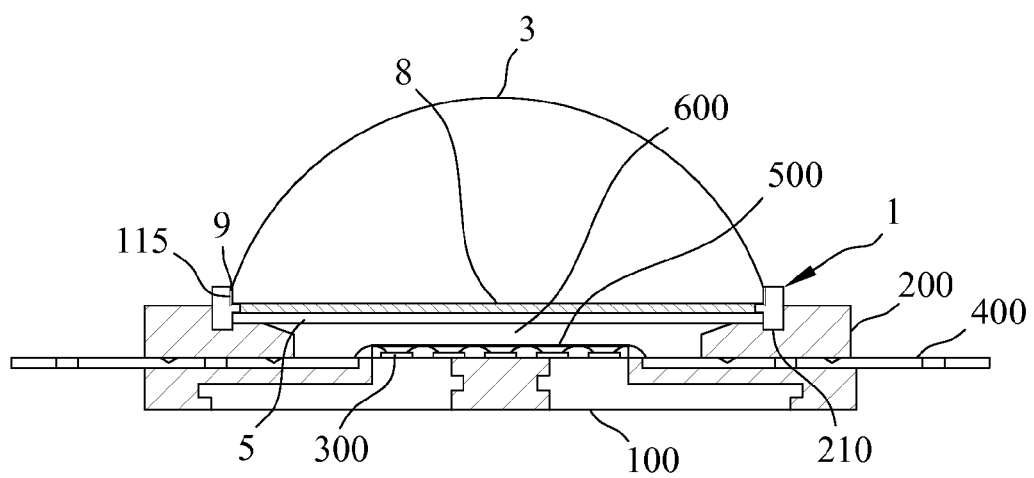
FIG. 11 is a schematic view showing a product made by the present invention being applied in an array-type LED according to one embodiment of the present invention.
Figure 12:
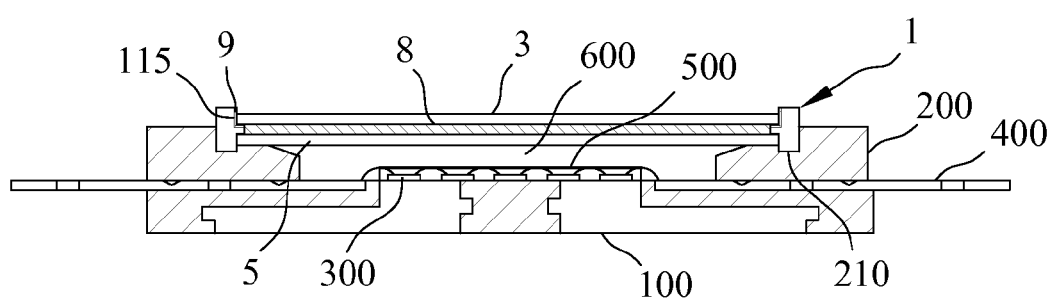
FIG. 12 is a schematic view showing a product made by the present invention being applied in an array-type LED according to another embodiment of the present invention.

Referring to FIG. 11, which is a schematic view showing an array-type LED made by the method of the present invention according to one embodiment of the present invention. Referring to FIG. 12, which is a schematic view showing an array-type LED made by the method of the present invention according to another embodiment of the present invention. An array-type LED includes a substrate 100 and a package module 200. The substrate 100 is disposed at the bottom of the array-type LED and is installed with a plurality of light emitting units 300. The light emitting units 300 are arranged on the substrate 100 in an array form. The light emitting units 300 are electrically connected to two lead frames 400 installed in the package module 200 by wire bonding. A dice protective layer 500 and a silicon layer 600 are sequentially formed on top of the light emitting units 300. The package module 200 is installed with a fastening frame slot 210 corresponding to the location of the partition frame 1 so that the partition frame 1 can be assembled with the package module 200. Therefore, the method of filling and sealing a fluorescent layer in a slot space defined by two optical lenses and a partition ring can be applied to an LED array package.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method of filling and sealing a fluorescent layer in a slot space defined by two optical lenses and a partition ring, comprising:

installing a partition frame, an inwardly protruding partition ring being arranged on an inner wall surface of the partition frame, a L-shaped structure being defined by a top surface of the partition ring and the inner wall surface of the partition frame, a reverse L-shaped structure being defined by a bottom surface of the partition ring and the inner wall surface of the partition frame, wherein the partition ring of the partition frame is installed with at least two slots;

installing a top optical glass and a bottom optical glass respectively on the top surface and the bottom surface of the partition ring, the top optical glass and the surface of the L-shaped structure, and the bottom optical glass and the surface of the reverse L-shaped structure being integrally adhered and sealed together, such that a slot space is defined by the top optical glass, the bottom optical glass, and the partition ring of the partition frame;

disposing the top optical glass, the bottom optical glass, and the partition frame adhered and sealed together in a vacuum chamber;

evacuating the slot space through the at least two slots, and filling a fluorescent material in the slot space so as to form a fluorescent layer; and utilizing an adhesive to seal the at least two slots;

wherein the at least two slots are through-holes installed in the partition ring diametrically opposite to each other, and a nail member coated with the adhesive is used to seal each of the at least two slots, and a material of the nail member includes at least one of plastic and metal.

2. The method according to claim 1, wherein a material of the partition frame includes at least one of glass, aluminum, bronze, ceramic and an alloy composed of at least one of aluminum and bronze.

3. The method according to claim 1, wherein a material of the partition frame includes at least one of liquid crystal polymer (LCP) and polyphthalamide (PPA).

4. The method according to claim 1, wherein the shape of the partition frame includes at least one of round, oval, rectangular and polygonal shapes.

5. The method according to claim 1, wherein the partition ring is made of at least one of ultraviolet curing adhesive, silicon, epoxy resin, and polyimide.

6. The method according to claim 1, wherein the top optical glass is a flat lens or a convex lens, and the bottom optical glass is a flat lens.

7. The method according to claim 1, wherein the adhesive includes at least one of ultraviolet curing adhesive, silicon, epoxy resin, and polyimide.

8. A method of filling and sealing a fluorescent layer in a slot space defined by two optical lenses and a partition ring, comprising:

installing a partition frame, an inwardly protruding partition ring being arranged on an inner wall surface of the partition frame, a L-shaped structure being defined by a top surface of the partition ring and the inner wall surface of the partition frame, a reverse L-shaped structure being defined by a bottom surface of the partition ring and the inner wall surface of the partition frame, wherein the partition ring of the partition frame is installed with at least two slots;

installing a top optical glass and a bottom optical glass respectively on the top surface and the bottom surface of the partition ring, the top optical glass and the surface of the L-shaped structure, and the bottom optical glass and the surface of the reverse L-shaped structure being integrally adhered and sealed together, such that a slot space is defined by the top optical glass, the bottom optical glass, and the partition ring of the partition frame;

disposing the top optical glass, the bottom optical glass, and the partition frame adhered and sealed together in a vacuum chamber;

evacuating the slot space through the at least two slots, and filling a fluorescent material in the slot space so as to form a fluorescent layer; and utilizing an adhesive to seal the at least two slots;

wherein the at least two slots are respectively installed on the surfaces of the partition ring diametrically opposite to each other, and the top optical glass is formed with at least two grooves diametrically opposite to each other, and the at least two grooves communicate with the at least two slots for allowing the adhesive to be filled into the at least two slots and the at least two grooves.

9. The method according to claim 8, wherein a material of the partition frame includes at least one of glass, aluminum, bronze, ceramic and an alloy composed of at least one of aluminum and bronze.

10. The method according to claim 8, wherein a material of the partition frame includes at least one of liquid crystal polymer (LCP) and polyphthalamide (PPA).

11. The method according to claim 8, wherein the shape of the partition frame includes at least one of round, oval, rectangular and polygonal shapes.

12. The method according to claim 8, wherein the partition ring is made of at least one of ultraviolet curing adhesive, silicon, epoxy resin, and polyimide.

13. The method according to claim 8, wherein the top optical glass is a flat lens or a convex lens, and the bottom optical glass is a flat lens.

14. The method according to claim 8, wherein the adhesive includes at least one of ultraviolet curing adhesive, silicon, epoxy resin, and polyimide.

15. A method of filling and sealing a fluorescent layer in a slot space defined by two optical lenses and a partition ring, comprising:

installing a partition frame, an inwardly protruding partition ring being arranged on an inner wall surface of the partition frame, a L-shaped structure being defined by a top surface of the partition ring and the inner wall surface of the partition frame, a reverse L-shaped structure being defined by a bottom surface of the partition ring and the inner wall surface of the partition frame, wherein the partition ring of the partition frame is installed with at least two slots;

installing a top optical glass and a bottom optical glass respectively on the top surface and the bottom surface of the partition ring, the top optical glass and the surface of the L-shaped structure, and the bottom optical glass and the surface of the reverse L-shaped structure being integrally adhered and sealed together, such that a slot space is defined by the top optical glass, the bottom optical glass, and the partition ring of the partition frame;

disposing the top optical glass, the bottom optical glass, and the partition frame adhered and sealed together in a vacuum chamber;

evacuating the slot space through the at least two slots, and filling a fluorescent material in the slot space so as to form a fluorescent layer; and utilizing an adhesive to seal the at least two slots;

wherein the two slots are formed on the surfaces of the L-shaped structures, and one opening end of each of the two slots is arranged on the inner surface of the partition ring, and the other opening end of each of the two slots is arranged on the top surface of the partition frame.

16. The method according to claim 15, wherein a material of the partition frame includes at least one of glass, aluminum, bronze, ceramic and an alloy composed of at least one of aluminum and bronze.

17. The method according to claim 15, wherein a material of the partition frame includes at least one of liquid crystal polymer (LCP) and polyphthalamide (PPA).

* * * * *